(12) United States Patent
Gao

(10) Patent No.: US 11,959,879 B2
(45) Date of Patent: Apr. 16, 2024

(54) METHOD AND DEVICE FOR DETERMINING CHARACTERISTICS OF METALLIC CASING AND CASING ATTENUATION

(71) Applicant: SOUTHWEST PETROLEUM UNIVERSITY, Chengdu (CN)

(72) Inventor: Guozhong Gao, Wuhan (CN)

(73) Assignee: Southwest Petroleum University, Chengdu (CN)

(*) Notice: Subject to any disclaimer, the term of this patent is extended or adjusted under 35 U.S.C. 154(b) by 0 days.

(21) Appl. No.: 17/716,512

(22) Filed: Apr. 8, 2022

(65) Prior Publication Data
US 2023/0228711 A1 Jul. 20, 2023

(30) Foreign Application Priority Data

Dec. 31, 2021 (CN) .......................... 202111674592.1

(51) Int. Cl.
G01N 27/80 (2006.01)
G01N 27/90 (2021.01)
(52) U.S. Cl.
CPC ......... *G01N 27/80* (2013.01); *G01N 27/9046* (2013.01)
(58) Field of Classification Search
CPC .................. G01N 27/80; G01N 27/9046
See application file for complete search history.

(56) References Cited

U.S. PATENT DOCUMENTS

| 6,294,917 | B1 * | 9/2001 | Nichols | ..................... | G01V 3/28 |
| | | | | | 324/346 |
| 2005/0156602 | A1 * | 7/2005 | Conti | ....................... | G01V 3/28 |
| | | | | | 324/339 |

* cited by examiner

Primary Examiner — Christopher P McAndrew
Assistant Examiner — Zannatul Ferdous

(57) ABSTRACT

Disclosed is a method and device for determining characteristics of metallic casing and casing attenuation, the method includes the following steps: obtaining the ratio of first magnetic field with metallic casing and without metallic casing at DC mode; obtaining magnetic related parameter of the metallic casing; obtaining magnetic permeability of metallic casing; obtaining the ratio of second magnetic field with metallic casing and without metallic casing at AC mode; obtaining electrical related parameter of the metal casing through the ratio of the second magnetic field and the magnetic related parameter of the metal casing; obtaining electrical conductivity of metallic casing through the electrical related parameter; obtaining casing attenuation of metallic casing through the magnetic related parameter and the electrical related parameter. The beneficial effect of this disclosure is: this method can obtain characteristics and casing attenuation of metallic casing without measuring impedance.

8 Claims, 7 Drawing Sheets

METHOD AND DEVICE FOR DETERMINING CHARACTERISTICS OF METALLIC CASING AND CASING ATTENUATION

FIELD OF THE DISCLOSURE

The disclosure relates to method and device for determining characteristics of metallic casing and casing attenuation.

BACKGROUND

Electromagnetic measurements through metallic pipes/casing are widely used in many different industries for different purposes, e.g., determination of the pipe property and corrosion in civil and environmental engineering, transportation, mineral, oil industry, etc.; determination of the EM attenuation due to the pipe to correct the EM signal in geophysical exploration. The theory described here is related to the general field of making electromagnetic (EM) measurements through metallic pipes and the determination of associated pipe property and EM signal attenuation due to the pipe, although focus is on the determination of the EM attenuation due to the pipe in geophysical exploration. Particularly, we are interested in determining the properties of the pipe, when a solenoid source or a magnetic dipole source is inside it. The solenoid can be cored or not cored.

It is well known that the EM attenuation due to the metallic casing is dependent on the casing properties (electric conductivity a, magnetic permeability $\mu$, casing thickness t, and casing OD) and the EM frequency. It is also found that many different combinations of the casing properties could give the same attenuation, however how to combine the casing properties remains unsolved until US patents U.S. Ser. No. 12/405,214 and U.S. Ser. No. 12/641,898.

Research has found that when EM signal passes through a metallic casing, the casing effects are local to the casing close to the source or receiver, and the casing effects are multiplicative. US patents U.S. Ser. No. 12/405,214 and U.S. Ser. No. 12/641,898 have made significant progresses to develop methods to determine the casing effects when EM signal passes through casing. If $H_0$ denotes the EM field without casing at a certain location and H denotes the EM field with casing at the same location, the ratio of them $$C=H/H_0, \quad (1)$$

Where C is the EM attenuation, and it is in general a complex quantity.

On the other hand, the impedance of the solenoid coil, the ratio of the drive voltage (V) to the current that flows through it (I) is the sum of its resistance (R) and inductive reactance where L is its self-inductance. In general, the impedance Z is in the form of the following:

$$Z=R+i\omega L \quad (2)$$

where $\omega$ is the angular frequency and $i=\sqrt{-1}$.

It is discovered that both C and Z are functions of the same two quantities $$C=f(\alpha',\beta) \quad (3)$$

$$Z/\omega=g(\alpha',\beta) \quad (4)$$

where $$\alpha'=\mu_r\mu_0 t \quad (5)$$

and $$\beta=\omega\sigma t \quad (6)$$

where $\mu_r$ is the relative magnetic permeability and $\mu_0$ is the magnetic permeability in the free space.

Clearly, $\beta$ is only related to the electrical property of the casing, while $\alpha'$ is only related to the magnetic property of the casing. It is discovered that in non-magnetic casing, both C and Z are only a function of $\beta$, and validated it using lab experiments. By measuring Z, we could determine both $\alpha'$ and $\beta$, after which C can be determined easily. Based on above developments, US patents U.S. Ser. No. 12/405,214 and U.S. Ser. No. 12/641,898 have developed many simple and efficient algorithms to determine the casing properties and the attenuation for both non-magnetic casing and carbon steel casing.

SUMMARY

In view of this, it is necessary to provide a method for determining characteristics of metallic casing and casing attenuation to solve the technical problem of the existing impedance measurement method based on AC mode to obtain characteristics and attenuation coefficient of metallic casing, which adds unnecessary process in technology and increases measurement cost in economy.

This disclosure provides a method for determining characteristics of metallic casing and casing attenuation, comprising the following steps:
  obtaining the ratio of first magnetic field with metallic casing and without metallic casing at DC mode;
  obtaining magnetic related parameter of the metallic casing through the ratio of the first magnetic field;
  obtaining magnetic permeability of metallic casing through the magnetic related parameter of the metallic casing;
  obtaining the ratio of second magnetic field with metallic casing and without metallic casing at AC mode;
  obtaining electrical related parameter of the metal casing through the ratio of the second magnetic field and the magnetic related parameter of the metal casing;
  obtaining electrical conductivity of metallic casing through the electrical related parameter of metallic casing;
  obtaining casing attenuation of metallic casing through the magnetic related parameter and the electrical related parameter of metallic casing.

Compared with the prior art, the beneficial effect of the technical solution proposed by this disclosure is: determining the magnetic related parameter of metallic casing by measuring the magnetic field change with metallic casing and without metallic casing at DC mode, and then obtaining the magnetic permeability of the metallic casing. Determining the electrical related parameter of the metallic casing by measuring the magnetic field change with and without the metallic casing at AC mode, and then the electrical conductivity was obtained. The casing attenuation of the metallic casing can be obtained through the magnetic related parameter and the electrical related parameter of the metallic casing, so that the characteristics and casing attenuation of the metallic casing can be obtained without measuring the impedance. Technically, the unnecessary process of measuring impedance is reduced; economically, the measurement cost is reduced.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
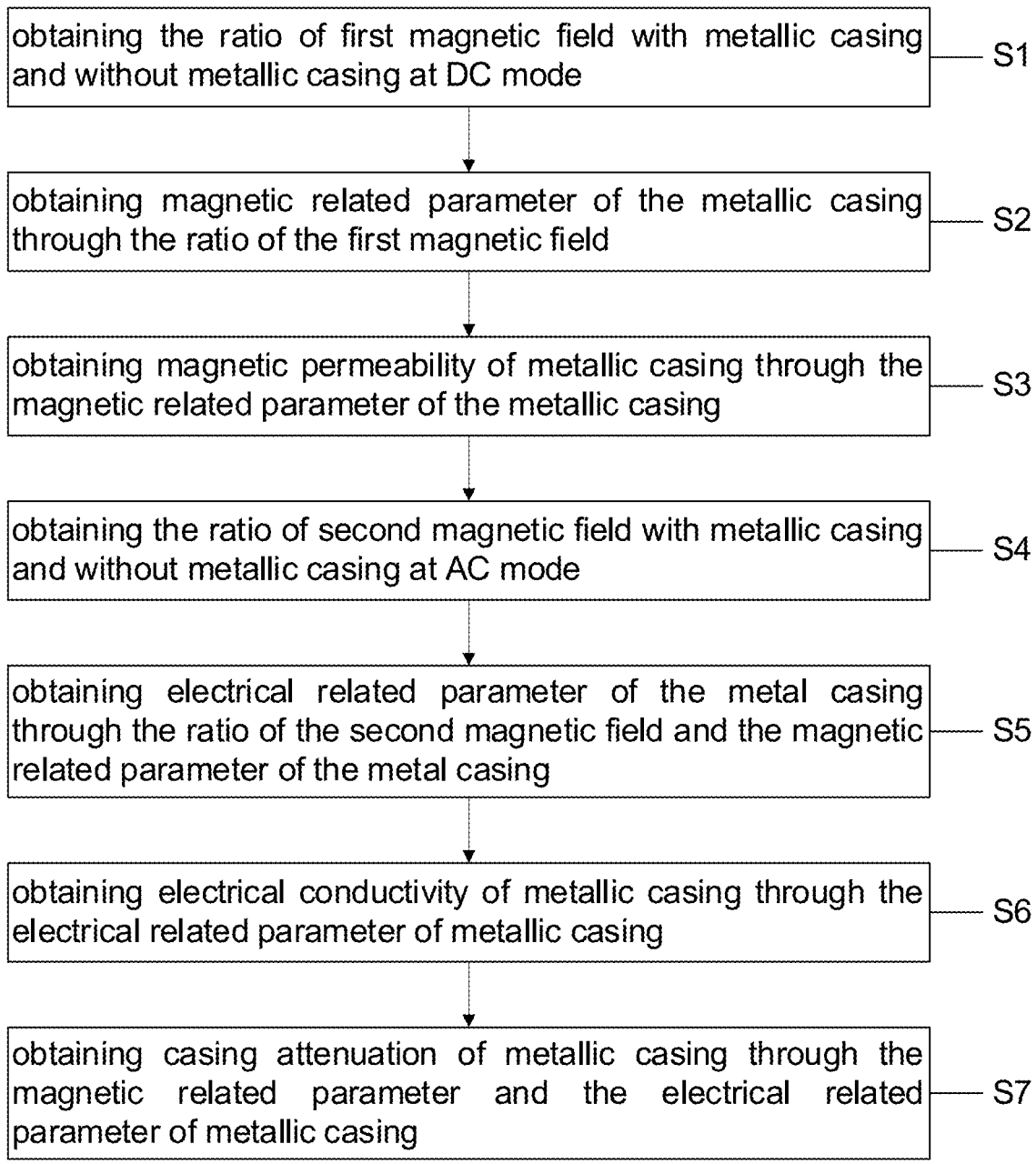
FIG. 1 is a schematic flowchart of an embodiment of the method for determining characteristics of metallic casing and casing attenuation provided by this disclosure.

As shown in FIG. 1, This disclosure provides a method for determining characteristics of metallic casing and casing attenuation, comprising the following steps:

S1, obtaining the ratio of first magnetic field with metallic casing and without metallic casing at DC mode;

S2, obtaining magnetic related parameter of the metallic casing through the ratio of the first magnetic field, specifically:

obtaining the relationship between the first magnetic field ratio and $\alpha/\mu_0$ by simulation; obtaining the magnetic related parameter of the metal casing through the first magnetic field ratio and $\mu_0$, where a is the magnetic related parameter and $\mu_0$ is the magnetic permeability in free space.

Wherein, the magnetic related parameter of the metallic casing is:

$$\alpha = (\mu_r - 1)\mu_0 t$$

where α is the magnetic related parameter of the metallic casing, $\mu_r$ is the relative magnetic permeability, $\mu_0$ is the magnetic permeability in free space, and t is the thickness of the metallic casing.

Please refer to Table 1. According to the excitation source and casing type, the factors affecting the effect of metallic casing can be summarized as follows:

TABLE 1

Classification of casing effect factor

| | non-magnetic casing ($\mu_r = 1$) | magnetic casing |
|---|---|---|
| DC (ω = 0) | No effect | α |
| AC | β | (α,β) |

Note: DC is direct current mode, and AC is alternating current mode.

In the magnetic casing, at DC mode, the casing effect is only related to the magnetic related parameter α. However, at DC mode (ω=0), equation (4) will not hold, which means that the solenoid impedance will be decoupled from the metallic casing. In other words, at DC mode, it is impossible to obtain the characteristics of the metallic casing by measuring the impedance of the solenoid.

Figure 2:
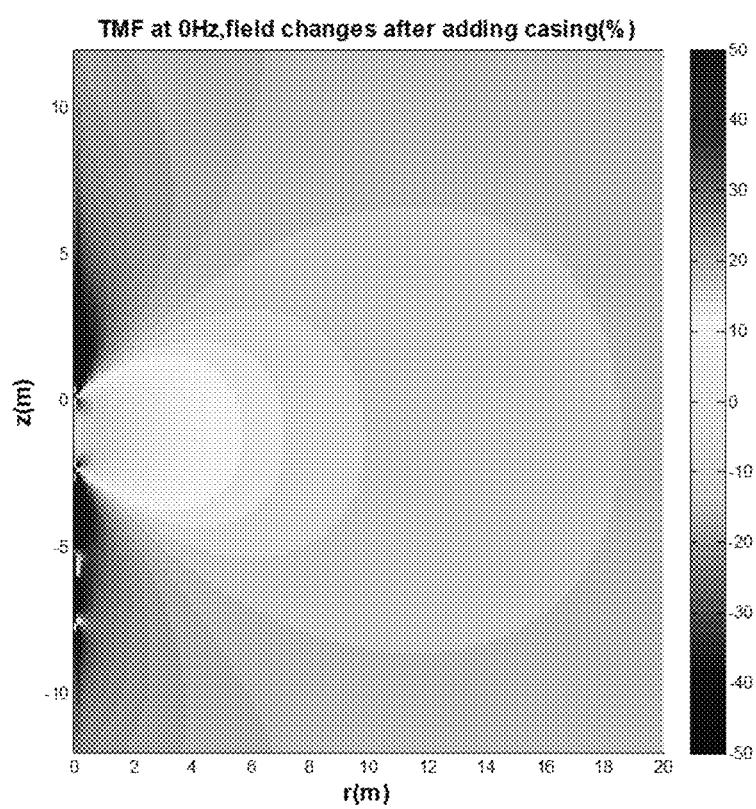
FIG. 2 shows the field changes (amplitude) in percentage from a solenoid after a casing was added, at DC mode.

Please refer to FIG. 2, FIG. 2 shows the field changes (amplitude) in percentage from a solenoid after a casing was added, at DC mode. The solenoid was placed between Z=−2.2 m and Z=0 m, and the spatial domain shown is r=20 m and Z=−12 m to 12 m. Clearly, the casing tends to increase the magnetic field in most of the domain except a small domain close to the solenoid, in which the magnetic field decreases. Nevertheless, the field is quite sensitive to the casing. In the modeling, we don't consider the hysteresis loss of the core, so in real measurements, it is preferable to do it in the low current range.

FIG. 2 shows that if we pick a spatial location, the magnetic field change at that location will be related to the casing property of the adjacent casing, which is a.

Figure 3:
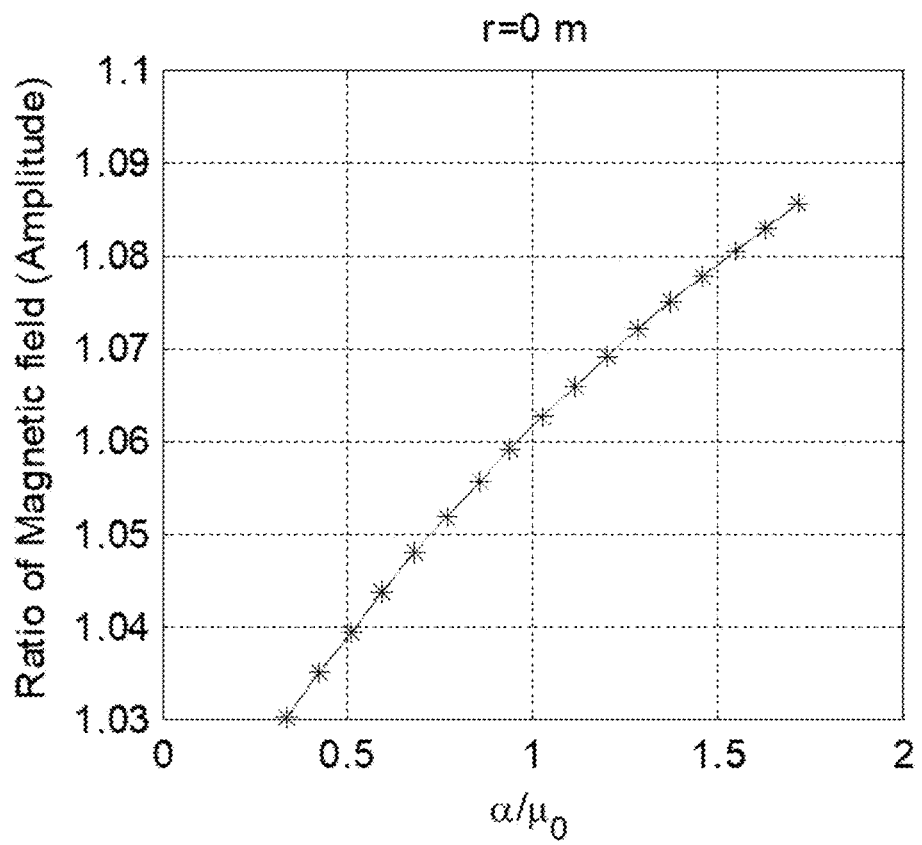
FIG. 3 shows the relationships between the magnetic field ratio with casing and without casing for two different spatial locations (r=0, z=0)
Figure 4:
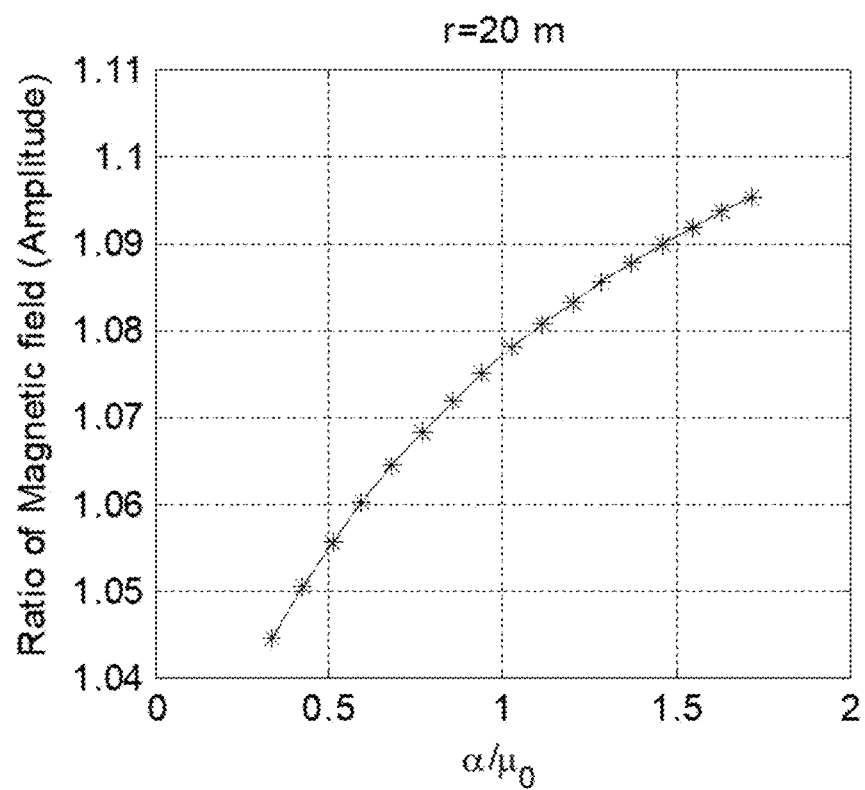
FIG. 4 shows the relationships between the magnetic field ratio with casing and without casing for two different spatial locations (r=20, z=0)

FIG. 3 and FIG. 4 show the relationships between the magnetic field ratio with casing and without casing for two different spatial locations (r=0, z=0) and (r=20, z=0), respectively, where z=0 is the center of the solenoid (note different convention from FIG. 2), and different values of a (normalized by $\mu_0$).

FIG. 3 and FIG. 4 show the magnetic field changes have a simple and unique well-defined relationship with a. In other words, if we can measure the magnetic field changes, a can be easily obtained, and vice versa. After a is determined, the magnetic permeability of the casing can be obtained using equation (7), if the casing thickness can be measured, or the thickness can be estimated if the casing magnetic permeability is known. This is particularly useful in the LAB where the magnetic permeability of the casing needs to be estimated. In so doing, we only need to measure the magnetic field at a particular location with casing and without casing at DC mode, then take the ratio, after which a can be determined using the relationship shown in FIG. 3 and FIG. 4. In the LAB, it is easy to measure the thickness of the casing, as a result, the magnetic permeability can be estimated. Note that it is not necessary for the solenoid to have a magnetic core. The relationship in FIG. 3 and FIG. 4 can be generated simply using computer modeling codes.

S3, obtaining magnetic permeability of metallic casing through the magnetic related parameter of the metallic casing; specifically:

obtaining the magnetic permeability of the metallic casing through the magnetic related parameter and the thickness of the metallic casing.

Determining the magnetic related parameter α of the metallic casing, and then measuring the thickness t of the metallic casing, the magnetic permeability of the metallic casing can be obtained from formula (7) (magnetic permeability $\mu_0$ in free space is a constant). This is especially useful in experiments where the magnetic permeability of metallic casing needs to be estimated.

In this way, we only need to measure the magnetic field at a specific location with and without casing at DC mode, and then calculate the ratio, and then the relationship shown in FIG. 3 and FIG. 4 can be used to determine the magnetic related parameter α. Furthermore, in laboratory, the thickness t of the metallic casing is easy to measure, so that the magnetic permeability of the metallic casing can be estimated. Note that the solenoid does not need to have a magnetic core.

S4, obtaining the ratio of second magnetic field with metallic casing and without metallic casing at AC mode;

S5, obtaining electrical related parameter of the metal casing through the ratio of the second magnetic field and the magnetic related parameter of the metal casing; specifically:

obtaining the relationship between the second magnetic field ratio, the magnetic related parameter of the metallic casing, and the electrical related parameter of the metallic casing by simulation, and obtaining the electrical related parameter of the metallic casing by combining the ratio of second magnetic field and the magnetic related parameter of the metallic casing.

$$\beta = \omega\sigma t \quad (8)$$

Wherein, the electrical related parameter of the metallic casing is:

$$\beta = \omega\sigma t$$

where $\beta$ is the electrical related parameter of the metal casing, $\omega$ is the angular frequency, $\sigma$ is the conductivity of the metal casing, t is the thickness of the metal casing.

Figure 5:
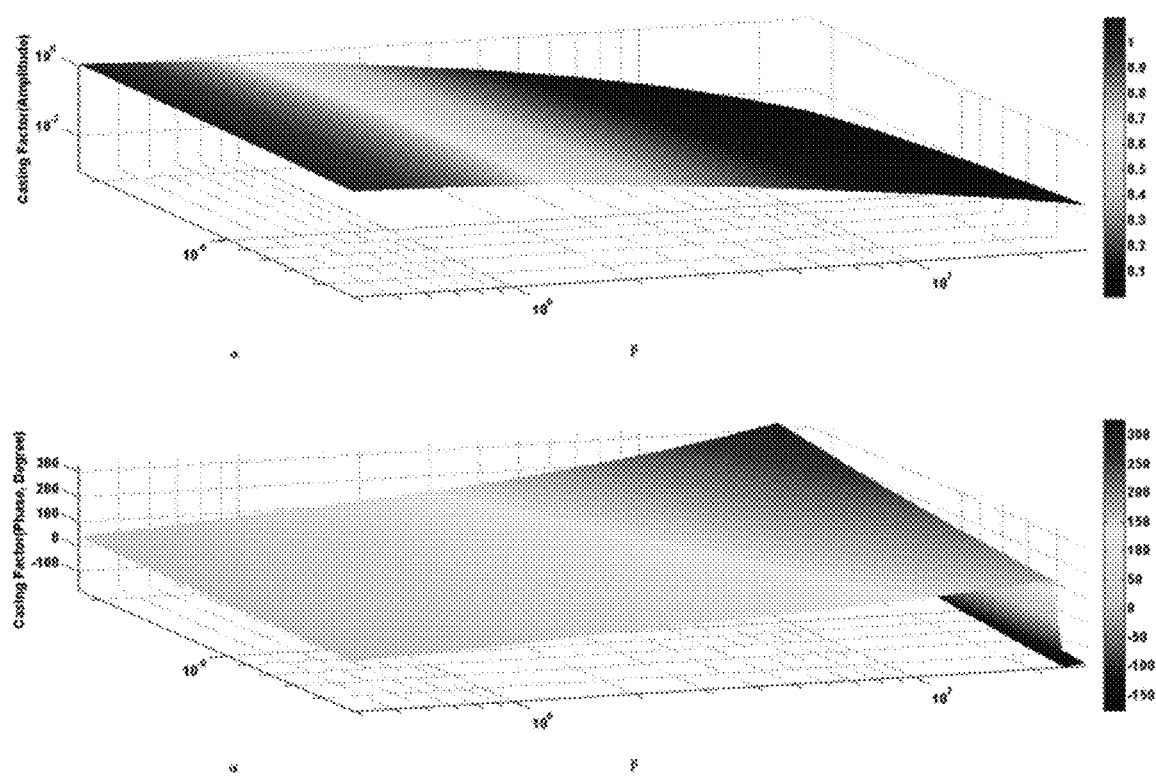
FIG. 5 is the relation between casing attenuation C, α, and β after converting α' in formula (3) into α at AC mode.

Please refer to FIG. 5, which shows the relation between casing attenuation C, $\alpha$, and $\beta$ after converting $\alpha'$ in formula (3) into $\alpha$ at AC mode. FIG. 5 can be pre-computed using an electromagnetic simulation program. Because $\alpha$ is already obtained at the DC mode, for a fixed $\alpha$, the casing factor has a simple relationship with $\beta$. As a result, if the casing factor is known, $\beta$ can be obtained easily using the relationship, and vice versa. In the LAB, it is easy to measure the magnetic field with casing and without casing at some spatial location, and the casing factor is simply the ratio of the two fields. After $\beta$ is obtained, because the casing thickness and the frequency are known, so the casing conductivity can be derived using equation 6, or the casing thickness can be estimated. In laboratory, at AC mode, measuring the magnetic field with and without casing at a certain spatial position, and then calculating the ratio of the two magnetic fields (the ratio is the casing attenuation C), and then obtaining the electrical related parameter $\beta$ according to the corresponding relationship in FIG. 5.

It should be noted that the electrical related parameter $\beta$ can also be obtained by impedance of the solenoid. Specifically, the impedance of the solenoid at a specific frequency is measured when the metal casing exists at AC mode. And obtaining the electrical related parameters of the metal casing according to the impedance of the solenoid and the magnetic related parameters of the metal casing.

Figure 6:
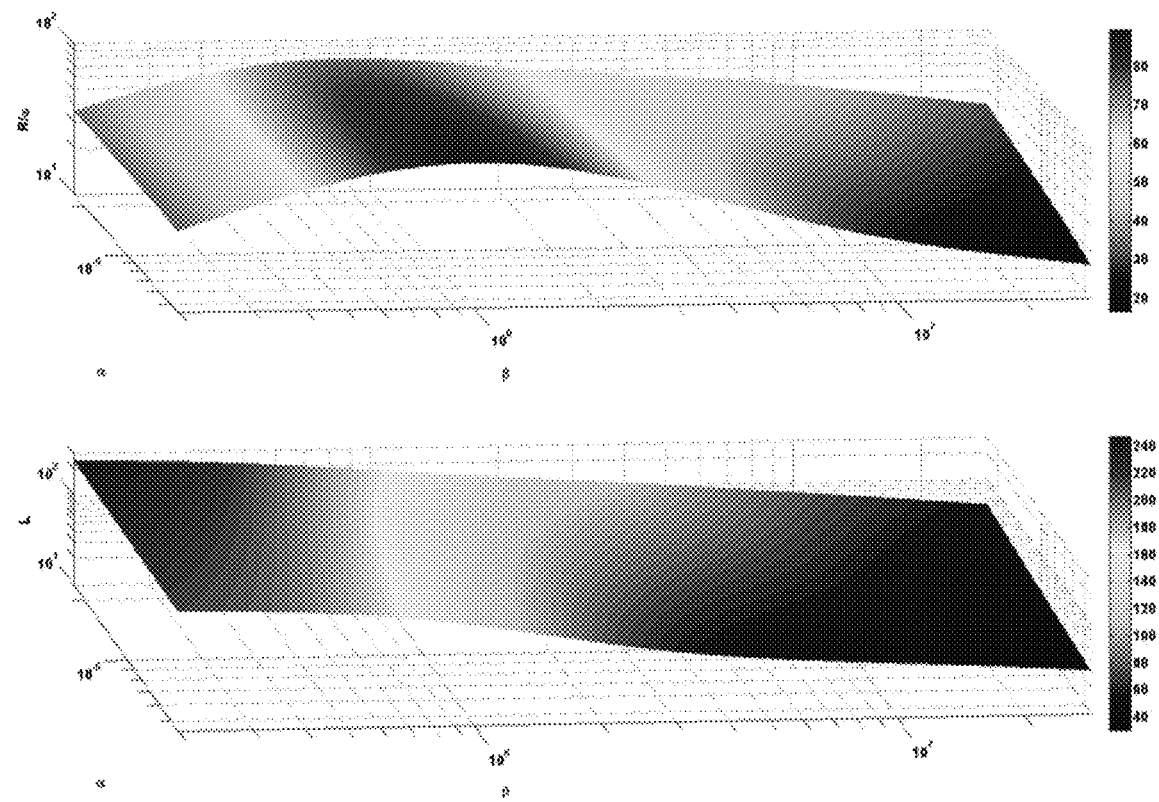
FIG. 6 is the relationship between Z/ω, α, and β after converting α' in formula (4) into α at AC mode.

FIG. 6 shows the relationship between $Z/\omega$, $\alpha$, and $\beta$ after converting $\alpha'$ in formula (4) into $\alpha$ at AC mode; Because a has been obtained at DC mode, for a fixed $\alpha$, $Z/\omega$ has a simple relationship with $\beta$. As a result, it is easy to determine $\beta$ using impedance. The relationship shown in FIG. 6 can be calculated in advance by electromagnetic simulation program.

Among the above two methods to determine the electrical related parameter $\beta$, the first method can only be used to measure $\beta$ in laboratory, while the second method is suitable for both the measurement of $\beta$ in laboratory and in the electromagnetic logging in the oilfield. This is because, in the first method, since the background medium (no casing) is unknown, it is impossible to accurately measure the electromagnetic field without metallic casing. As a result, only the second method using impedance measurements is possible. Of course, to determine $\alpha$, there is no such requirement, and the magnetic field without metallic casing can be measured at the surface; in the LAB, or even pre-computed using computer simulation. Then, the tool is lowered in the borehole, and the magnetic field in casing can be measured.

S6, obtaining electrical conductivity of metallic casing through the electrical related parameter of metallic casing; specially:

obtaining the conductivity of the metal casing according to the electrical related parameters of the metal casing, the thickness of the metal casing, and the angular frequency of the magnetic field source.

After obtaining $\beta$, since the thickness and angular frequency $\omega$ of the metallic casing are known, the electrical conductivity of the metallic casing can be deduced from Equation (8).

S7, obtaining casing attenuation of metallic casing through the magnetic related parameter and the electrical related parameter of metallic casing. Specifically:

obtaining the relationship between the second magnetic field ratio, the magnetic related parameters of the metal casing, and the electrical related parameters of the metal casing by simulation; obtaining the ratio of the second magnetic field as the casing attenuation of the metal casing by combining the magnetic related parameter of the metal casing and the electrical related parameter of the metal casing.

After determining $\alpha$ and $\beta$, the electromagnetic attenuation C caused by metallic casing at any frequency can be easily obtained using FIG. 5.

The above method can also be applied to downhole logging in the oilfield to obtain the properties and electromagnetic attenuation of the casing. The obtained results can be log curves of $\alpha$, $\beta$, and electromagnetic attenuation, which can be used for casing correction of single well or inter-well electromagnetic logging through casing. $\alpha$ and $\beta$ logs can be used to check casing integrity, as these log anomalies can reflect the quality of the metallic casing.

Figure 7:
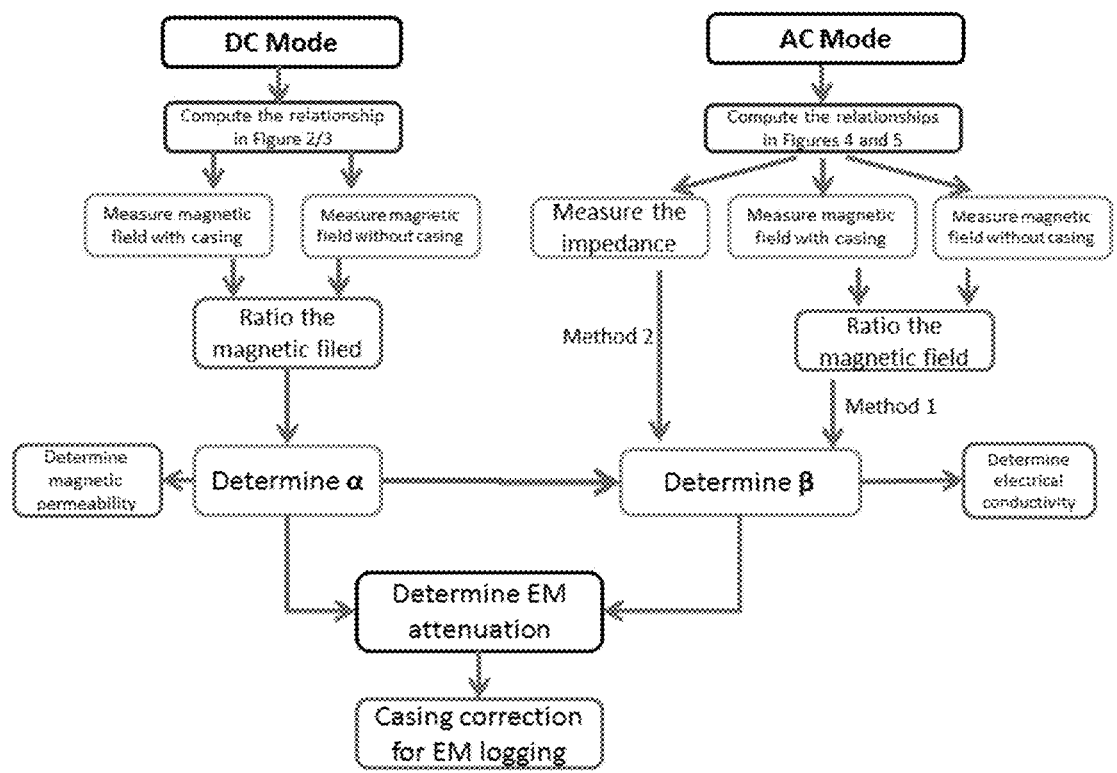
FIG. 7 is the complete flow chart of the method for determining characteristics of metallic casing and casing attenuation in FIG. 1.

The complete flow chart of above-mentioned process is shown in FIG. 7. FIG. 7 includes methods applicable to both the LAB and the field: the DC mode applies to both LAB and field; at AC mode, both method 1 and method 2 apply to LAB, while only method 2 apply to the field, because method 2 requires the knowledge of the background medium. Note that the field application does not require the LAB measurements, since they are independent.

This disclosure also provides a device for determining characteristics of metallic casing and casing attenuation, comprising a processor and a memory, and a computer program is stored on the memory, and when the computer program is executed by the processor, the method for determining the characteristics of the metal casing and the casing attenuation is realized.

In summary, by determining the magnetic related parameter of metallic casing by measuring the magnetic field change with metallic casing and without metallic casing at DC mode, and then obtaining the magnetic permeability of the metallic casing. Determining the electrical related parameter of the metallic casing by measuring the magnetic field change with and without the metallic casing at AC mode, and then the electrical conductivity was obtained. The casing attenuation of the metallic casing can be obtained through the magnetic related parameter and the electrical related parameter of the metallic casing, so that the characteristics and casing attenuation of the metallic casing can be obtained without measuring the impedance. Technically, the unnecessary process of measuring impedance is reduced; economically, the measurement cost is reduced.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for determining characteristics of metallic casing and casing attenuation, comprising the following steps:
   obtaining the ratio of first magnetic field intensities around a solenoid with a metallic casing and without the metallic casing at DC mode;
   obtaining magnetic related parameter of the metallic casing through the ratio of the first magnetic field, specifically:
      obtaining the relationship between the first magnetic field ratio and $\alpha/\mu_0$ by simulation;
      obtaining the magnetic related parameter of the metallic casing through the first magnetic field ratio and $\mu_0$, where $\alpha$ is the magnetic related parameter and $\mu_0$ is the magnetic permeability in free space;
   obtaining magnetic permeability of metallic casing through the magnetic related parameter of the metallic casing;
   obtaining the ratio of second magnetic field intensities around a solenoid with the metallic casing and without the metallic casing at AC mode;
   obtaining electrical related parameter of the metallic casing through the ratio of the second magnetic field and the magnetic related parameter of the metallic casing;
   obtaining electrical conductivity of metallic casing through the electrical related parameter of metallic casing, specifically:
      obtaining the relationship between the second magnetic field ratio, the magnetic related parameter of the metallic casing, and the electrical related parameter of the metallic casing by simulation, and obtaining the electrical related parameter of the metallic casing by combining the ratio of second magnetic field and the magnetic related parameter of the metallic casing;
   obtaining casing attenuation of metallic casing through the magnetic related parameter and the electrical related parameter of metallic casing.

2. The method for determining characteristics of metallic casing and casing attenuation according to claim 1, the magnetic related parameter of the metallic casing is:

$$\alpha = (\mu_r - 1)\mu_0 t$$

where $\alpha$ is the magnetic related parameter of the metallic casing, $\mu_r$ is the relative magnetic permeability, $\mu_0$ is the magnetic permeability in free space, and $t$ is the thickness of the metallic casing.

3. The method for determining characteristics of metallic casing and casing attenuation according to claim 2, obtaining magnetic permeability of metallic casing through the magnetic related parameter of the metallic casing, specifically:
   obtaining the magnetic permeability of the metallic casing through the magnetic related parameter and the thickness of the metallic casing.

4. The method for determining characteristics of metallic casing and casing attenuation according to claim 1, the electrical related parameter of the metallic casing is:

$$\beta = \omega \sigma t$$

where $\beta$ is the electrical related parameter of the metallic casing, $\omega$ is the angular frequency, $\sigma$ is the conductivity of the metallic casing, $t$ is the thickness of the metallic casing.

5. The method for determining characteristics of metallic casing and casing attenuation according to claim 1, obtaining electrical conductivity of metallic casing through the electrical related parameter of metallic casing, specifically:
   obtaining the conductivity of the metallic casing according to the electrical related parameters of the metallic casing, the thickness of the metallic casing, and the angular frequency of the magnetic field source.

6. The method for determining characteristics of metallic casing and casing attenuation according to claim 1, obtaining casing attenuation of metallic casing through the magnetic related parameter and the electrical related parameter of metallic casing, specifically:
   obtaining the relationship between the second magnetic field ratio, the magnetic related parameters of the metallic casing, and the electrical related parameters of the metallic casing by simulation; obtaining the ratio of the second magnetic field as the casing attenuation of the metallic casing by combining the magnetic related parameter of the metallic casing and the electrical related parameter of the metallic casing.

7. The method for determining characteristics of metallic casing and casing attenuation according to claim 1, after the step of obtaining electrical related parameter of the metallic casing through the ratio of the second magnetic field and the magnetic related parameter of the metallic casing, the method also includes:
   measuring the impedance of solenoid at a certain frequency when the metallic casing exists in the AC mode, and obtaining the electrical related parameter of the metallic casing according to the impedance of the solenoid and the magnetic related parameter of the metallic casing.

8. A device for determining characteristics of metallic casing and casing attenuation, comprising a processor and a memory, and a computer program is stored on the memory, and when the computer program is executed by the processor, cause the processor to:
   obtain the ratio of first magnetic field intensities around a solenoid with a metallic casing and without the metallic casing at DC mode;
   obtain magnetic related parameter of the metallic casing through the ratio of the first magnetic field;
   obtain magnetic permeability of metallic casing through the magnetic related parameter of the metallic casing;
   obtain the ratio of second magnetic field intensities around a solenoid with the metallic casing and without the metallic casing at AC mode;
   obtain electrical related parameter of the metallic casing through the ratio of the second magnetic field and the magnetic related parameter of the metallic casing;
   obtain electrical conductivity of metallic casing through the electrical related parameter of metallic casing;
   obtain casing attenuation of metallic casing through the magnetic related parameter and the electrical related parameter of metallic casing.

* * * * *